(12) United States Patent
Son et al.

(10) Patent No.: US 12,512,305 B2
(45) Date of Patent: Dec. 30, 2025

(54) PLASMA PROCESSING APPARATUS AND PLASMA CONTROL METHOD USING MAGNETIC FIELD

(71) Applicant: SEMES CO., LTD., Chungcheongnam-do (KR)

(72) Inventors: Duk Hyun Son, Chungcheongnam-do (KR); Dong Mok Lee, Chungcheongnam-do (KR); Hyung Joon Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 348 days.

(21) Appl. No.: 18/097,728

(22) Filed: Jan. 17, 2023

(65) Prior Publication Data

US 2023/0317427 A1    Oct. 5, 2023

(30) Foreign Application Priority Data

Apr. 1, 2022    (KR) .......................... 10-2022-0041080

(51) Int. Cl.
*H01J 37/32* (2006.01)
*H01F 7/02* (2006.01)
(Continued)

(52) U.S. Cl.
CPC .......... *H01J 37/32669* (2013.01); *H01F 7/02* (2013.01); *H01F 7/20* (2013.01); *H01J 37/3211* (2013.01); *H01L 21/6831* (2013.01); *H01F 27/24* (2013.01); *H01F 27/28* (2013.01); *H01J 37/32155* (2013.01);
(Continued)

(58) Field of Classification Search
USPC .............. 156/345.46; 118/723 MA, 723 MR
See application file for complete search history.

(56) References Cited

U.S. PATENT DOCUMENTS 5,470,426 A * 11/1995 Yoshida ................ H01J 37/321
156/345.46
2002/0005253 A1 * 1/2002 Tu ......................... H01J 37/321
156/345.12
(Continued)

FOREIGN PATENT DOCUMENTS

KR          10-0483355    *  4/2005 ........ H01J 37/32669
KR    10-2006-0002201 A     1/2006
(Continued)

OTHER PUBLICATIONS

Korean Office Action issued in corresponding KR Patent Application No. 10-2022-0041080 on Feb. 16, 2024, with English translation.

*Primary Examiner* — Ram N Kackar
(74) *Attorney, Agent, or Firm* — Carter, DeLuca & Farrell LLP (57) ABSTRACT

A plasma processing apparatus using a magnetic field includes a reaction chamber, a plasma generating device connected to the reaction chamber to generate plasma in the reaction chamber, a substrate support disposed in a lower portion in the reaction chamber to support a wafer to be etched by the plasma, and a magnetic module including a permanent magnet and an electromagnet disposed vertically above the reaction chamber and a DC power supply unit connected to the electromagnet to input power to the electromagnet.

15 Claims, 10 Drawing Sheets

(51) Int. Cl.
  *H01F 7/20* (2006.01)
  *H01L 21/683* (2006.01)
  *H01F 27/24* (2006.01)
  *H01F 27/28* (2006.01)

(52) U.S. Cl.
  CPC .................. *H01J 2237/2007* (2013.01); *H01J 2237/24564* (2013.01); *H01J 2237/334* (2013.01)

(56) References Cited

U.S. PATENT DOCUMENTS

| | | | |
|---|---|---|---|
| 2006/0157201 A1* | 7/2006 | Hoffman | H01J 37/3266 156/345.46 |
| 2011/0309050 A1 | 12/2011 | Iori et al. | |
| 2016/0027667 A1* | 1/2016 | Sadjadi | H01J 37/3244 438/798 |
| 2017/0040170 A1* | 2/2017 | Guha | H01L 21/67069 |

FOREIGN PATENT DOCUMENTS

| | | |
|---|---|---|
| KR | 10-2009-0033718 A | 4/2009 |
| KR | 10-2011-0099145 A | 9/2011 |
| KR | 10-2014-0139960 A | 12/2014 |

* cited by examiner

PLASMA PROCESSING APPARATUS AND PLASMA CONTROL METHOD USING MAGNETIC FIELD

CROSS-REFERENCE TO RELATED APPLICATIONS

This application claims benefit of priority to Korean Patent Application No. 10-2022-0041080 filed on Apr. 1, 2022 in the Korean Intellectual Property Office, the disclosure of which is incorporated herein by reference in its entirety.

BACKGROUND

1. Field

The present disclosure relates to an etching apparatus, and more particularly, to a plasma processing apparatus and a plasma control method using a magnetic field.

2. Description of Related Art

When plasma is generated in a reaction chamber to manufacture a semiconductor device, it is necessary to uniformly control the plasma density in order to uniformly treat the entire surface of a wafer.

However, plasma density may be high in the center region of a wafer while plasma density may be low in the edge region of the wafer, and the wafer may be etched at an angle unless separate plasma density control is performed.

Therefore, it is important to control the plasma density of the middle region between the center region and the edge region of the wafer in order to alleviate a gradient occurring in the plasma density, and there is a need for an invention that provides a dense magnetic field to the corresponding region.

However, in the related art, a first magnetic field generating unit is provided on an upper wall of a vacuum container and a second magnetic field generating unit is provided on a sidewall of the vacuum container, so that magnetic field lines may be formed throughout the vacuum chamber, but it is difficult to perform plasma density control in detail, based on the middle region of the wafer, and in particular, since positions of the first magnetic field generating unit and the second magnetic field generating unit are different, a direction of the magnetic field generated accordingly is also completely changed, so the magnetic field control for the middle region of the wafer is not delicate.

Therefore, in order to control the density of a desired region, an invention for magnetic field units capable of forming magnetic fields in the same direction and adjusting minutely the magnetic fields by reinforcing or canceling out the strength thereof is required.

SUMMARY

Exemplary embodiments provide a plasma processing apparatus and a plasma control method using a magnetic field, which may easily control a plasma density corresponding to a middle region of a wafer by allowing magnetic fields formed by a permanent magnet and an electromagnet to be formed in parallel in a reaction chamber.

According to an aspect of the present disclosure, a plasma processing apparatus using a magnetic field includes: a reaction chamber; a plasma generating device connected to the reaction chamber to generate plasma in the reaction chamber; a substrate support disposed in a lower portion in the reaction chamber to support a wafer to be etched by the plasma; and a magnetic module including a permanent magnet and an electromagnet disposed vertically above the reaction chamber and a DC power supply unit connected to the electromagnet to input power to the electromagnet.

According to another aspect of the present disclosure, a plasma processing apparatus using a magnetic field includes: a reaction chamber; a plasma generating device including a plurality of tubular linear antennas connected to the reaction chamber and installed to be parallel above the reaction chamber and spaced apart from each other to generate plasma in the reaction chamber, and an RF power supply supplying RF power to the antennas to generate plasma in the reaction chamber; an electrostatic chuck disposed in a lower portion in the reaction chamber and supporting a wafer to be etched by the plasma; a magnetic module including a ring-shaped permanent magnet disposed on an upper plate of the reaction chamber to overlap at least a portion of a middle region of the wafer to adjust an etch rate in the middle region between a center region and an edge region of the wafer, an electromagnet disposed to be perpendicular to the permanent magnet, and a DC power supply unit connected to the electromagnet and inputting power to the electromagnet; and a signal determining unit determining current or voltage input to the electromagnet according to a difference in coercive force with the permanent magnet in consideration of a target etch rate of the wafer.

According to another aspect of the present disclosure, a plasma control method includes generating plasma in a reaction chamber; determining a strength or direction of a magnetic field to be supplied to the reaction chamber according to a target etch rate of a wafer; determining a power parameter corresponding to the strength or direction of the magnetic field determined in consideration of a difference in coercive force between a permanent magnet and an electromagnet positioned vertically above the reaction chamber; and providing the determined power parameter to a DC power supply unit connected to the electromagnet and controlling a plasma density in the reaction chamber according to the strength or direction of the formed magnetic field.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms, such as "above", "upper portion", "upper surface", "below", "lower portion", "lower surface", "lateral surface", and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

Figure 1:
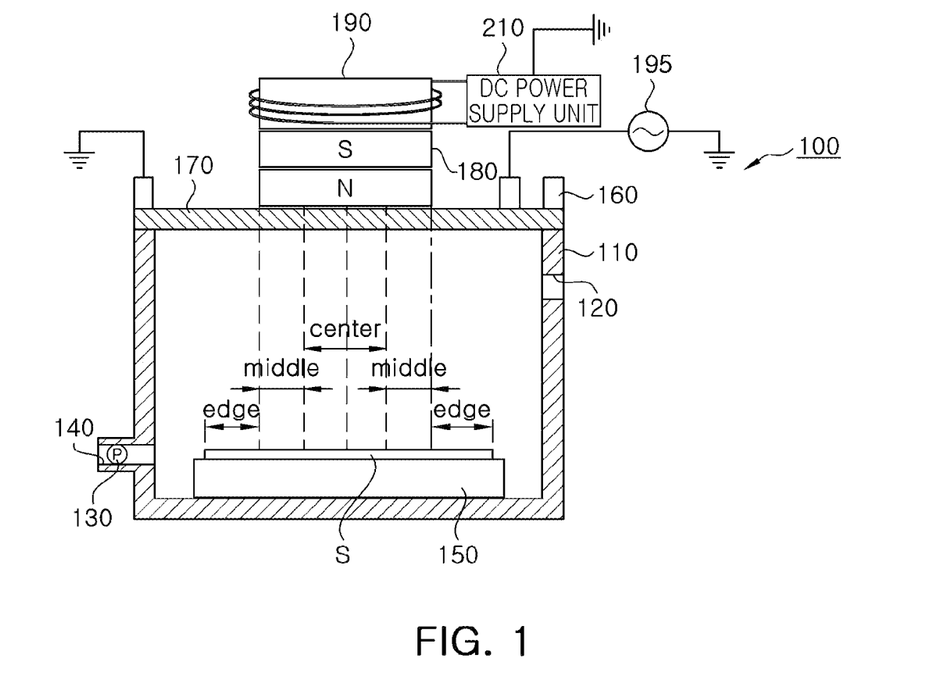
FIG. 1 is a cross-sectional view schematically illustrating a structure of a plasma processing apparatus using a magnetic field according to an exemplary embodiment in the present disclosure.
Figure 2:
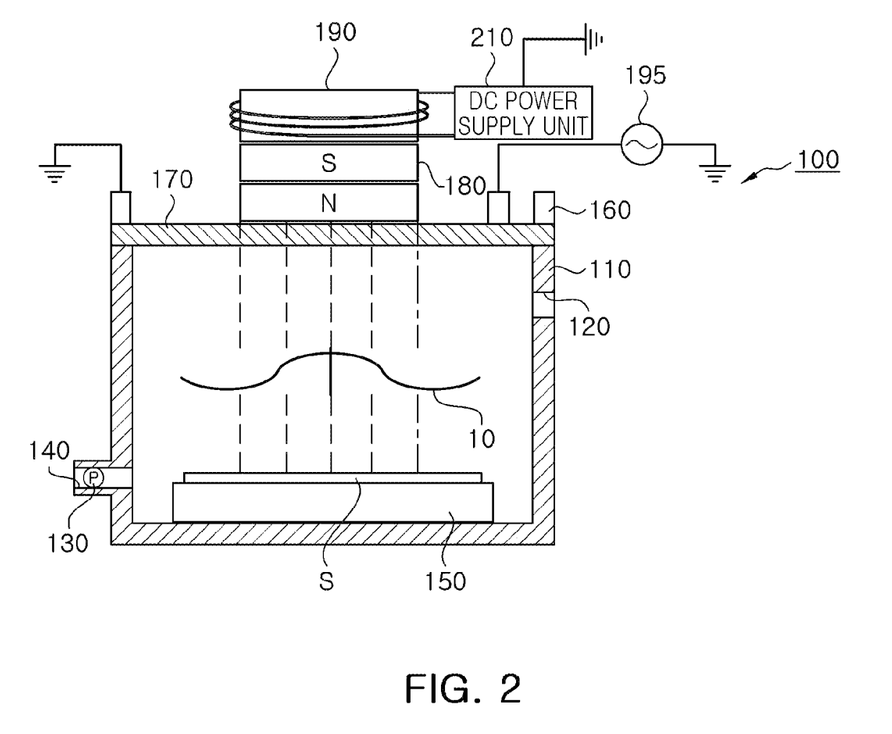
FIG. 2 is a view illustrating a plasma density before forming a magnetic field in a plasma processing apparatus using a magnetic field according to an exemplary embodiment in the present disclosure.
Figure 3:
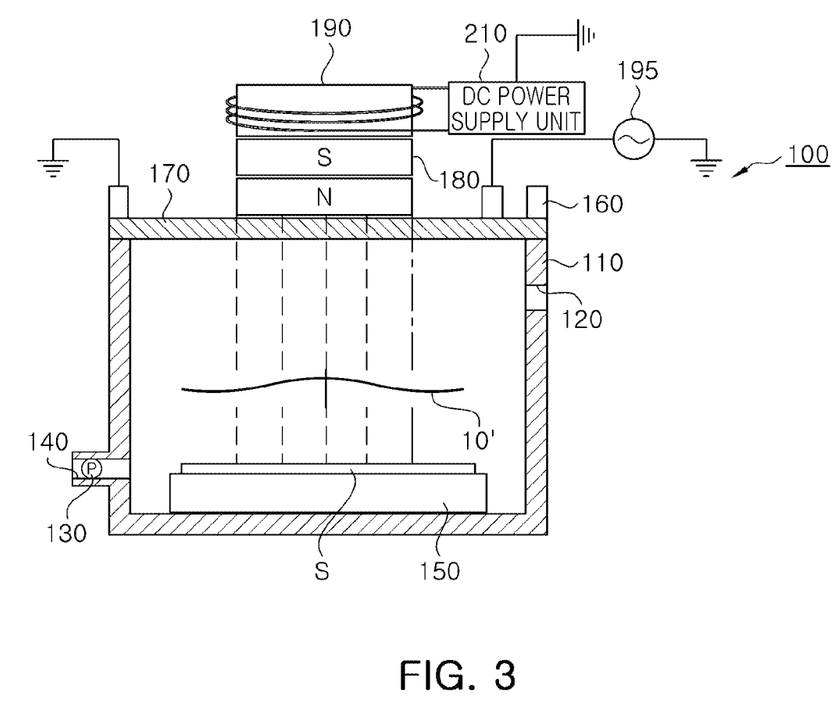
FIG. 3 is a view illustrating a plasma density after forming a magnetic field in a plasma processing apparatus using a magnetic field according to an exemplary embodiment in the present disclosure.
Figure 4:
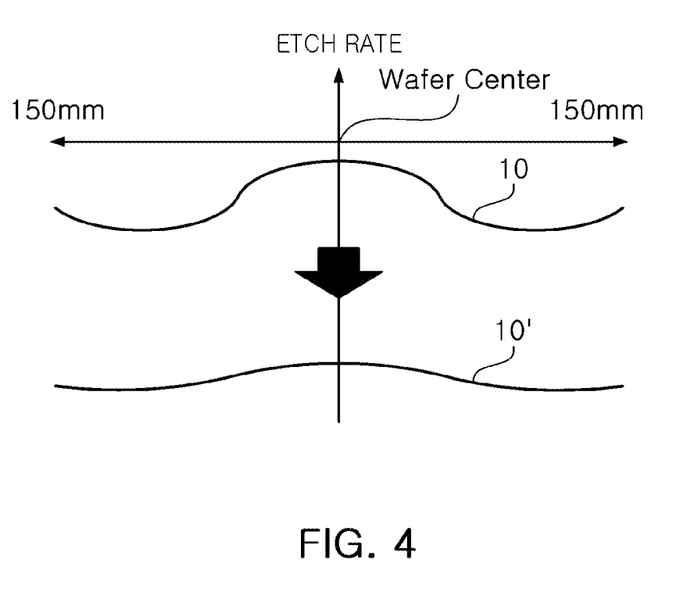
FIG. 4 is a view illustrating comparison of etch rates according to wafer regions according to plasma densities formed in FIGS. 2 and 3.

FIG. 1 is a cross-sectional view schematically illustrating a structure of a plasma processing apparatus 100 using a magnetic field according to an exemplary embodiment in the present disclosure, and FIGS. 2 to 4 are views illustrating plasma densities before and after forming a magnetic field in the plasma processing apparatus 100 using a magnetic field according to an exemplary embodiment in the present disclosure.

The plasma processing device 100 using a magnetic field according to an exemplary embodiment in the present disclosure a reaction chamber 110, plasma generating devices 160 and 195 connected to the reaction chamber 110 to generate plasma in the reaction chamber 110, a substrate support 150 disposed in a lower portion in the reaction chamber 110 to support a wafer S to be etched by the plasma, and a magnetic module including a permanent magnet 180 and an electromagnet 190 disposed vertically above the reaction chamber 110 and a DC power supply unit 210 connected to the electromagnet 190 to input power to the electromagnet.

Specifically, as illustrated in FIG. 1, the plasma processing apparatus 100 using a magnetic field according to an exemplary embodiment in the present disclosure may include the reaction chamber 110, a plasma generating device including plurality of tubular linear antennas 160 connected to the reaction chamber 110, installed to be parallel above the reaction chamber and spaced apart from each other to generate plasma in the reaction chamber 110, and an radio frequency (RF) power supply 195 supplying RF power to the antennas 160 to generate plasma in the reaction chamber, and an electrostatic chuck disposed in a lower portion in the reaction chamber 110 and supporting a wafer S to be etched by the plasma.

Here, as illustrated in FIG. 1, in order to adjust an etch rate in a middle region between a center region and an edge region of the wafer S, the plasma processing apparatus may further include the permanent magnet 180 disposed on an upper plate 170 of the reaction chamber corresponding to the middle region of the wafer S, the electromagnet 190 disposed to be perpendicular to the permanent magnet 180, and a DC power supply unit 210 connected to the electromagnet 190 and inputting power to the electromagnet 190.

In other words, the plasma processing apparatus 100 according to an exemplary embodiment in the present disclosure may include the RF power supply 195, an antenna 160, the reaction chamber 110, the permanent magnet 180, the electromagnet 190, and the DC power supply unit 210, and here, the RF power supply 195, the antenna 160, and the reaction chamber 110 have the same structures and functions as those installed in the plasma processing apparatus of the related art, and thus, a redundant description thereof will be omitted.

In addition, the plasma processing apparatus 100 according to an exemplary embodiment in the present disclosure further includes a gas inlet 120, a gas outlet 140, a vacuum pump 130, an upper plate 170, an electrostatic chuck, and the like. The structures and functions thereof are the same as those of the conventional plasma processing apparatus and will not be repeatedly described here.

However, the components mentioned in the electrostatic chuck and the plasma generating devices 160 and 195 are merely exemplary embodiments, and do not exclude other components performing the same function.

As illustrated in FIGS. 1 to 3, in the plasma processing apparatus 100 according to an exemplary embodiment in the present disclosure, the permanent magnet 180 and the electromagnet 190 are coupled and installed, and the permanent magnet 180 may be installed to be closer to the upper plate 170 than the electromagnet 190.

In other words, the electromagnet 190 may be located above the permanent magnet 180.

Also, as an exemplary embodiment, the permanent magnet 180 and the electromagnet 190 may be installed on an outer wall surface of the reaction chamber 110 as illustrated in FIG. 1. This is to prevent the permanent magnet 180 and the electromagnet 190 from being affected by plasma. In addition, when installed outside, an internal structure of the reaction chamber 110 is simplified to help uniformity of plasma and the operation and maintenance of the permanent magnet 180 and the electromagnet 190 are easy.

However, as another exemplary embodiment, both the permanent magnet 180 and the electromagnet 190 may be installed inside the chamber 110, or the permanent magnet 180 may be installed inside the chamber 110 and the electromagnet 190 may be installed outside the chamber 110.

For example, the permanent magnet 180 may be disposed such that one magnetic pole thereof faces the inside of the reaction chamber 110 and the other magnetic pole thereof faces the outside of the reaction chamber 100. For example, as illustrated in FIG. 1, an N pole may be disposed as a lower magnetic pole 181 (illustrated in FIG. 5) and an S pole may be disposed as an upper magnetic pole 182 (illustrated in FIG. 5).

In addition, as an exemplary embodiment, the electromagnet 190 may include a magnetic core and a coil wound around the magnetic core, and the coil may be wound to be horizontally disposed to reinforce or cancel out a magnetic field formed by the permanent magnet 190. As illustrated in FIG. 1, the coil may be wound in a horizontal direction to form a magnetic field in the same direction as a direction of the magnetic field formed by the permanent magnet 180.

In other words, the magnetic fields of the permanent magnet 180 and the electromagnet 190 may be formed to be parallel. Through this, the magnetic fields formed by the permanent magnet 180 and the electromagnet 190 may be formed to face the wafer S seated in the reaction chamber 110, and density of plasma located above the wafer S may be controlled.

Before the magnetic fields are formed by the permanent magnet 180 and the electromagnet 190, the density of plasma is not uniform and forms a curve non-uniformly over the entire wafer S as shown in FIG. 2.

However, as illustrated in FIG. 3, as the magnetic fields are formed by the permanent magnet 180 and the electromagnet 190, a strong magnetic field may be to a middle region of the wafer S, so that a density 10' of plasma formed at an angle in the middle region is flattened, and the density 10' of plasma is uniformly formed throughout the wafer S.

According to the density 10 of plasma before the formation of the magnetic field and the density 10' of plasma after the formation of the magnetic field illustrated in FIGS. 2 and 3, an etch rate performed on the entire wafer S is also uniform as illustrated in FIG. 4. When a radius of the wafer is 150 mm, before the formation of the magnetic field, the etch rate is high in the center region of the wafer S and the etch rate is inclined in the middle region of the wafer S, so that an overall etch rate forms a curve, but after the formation of the magnetic field, the inclination of the middle region of the wafer S is relaxed, so that etch rate deviation between the center region and the edge region is reduced.

Figure 5:
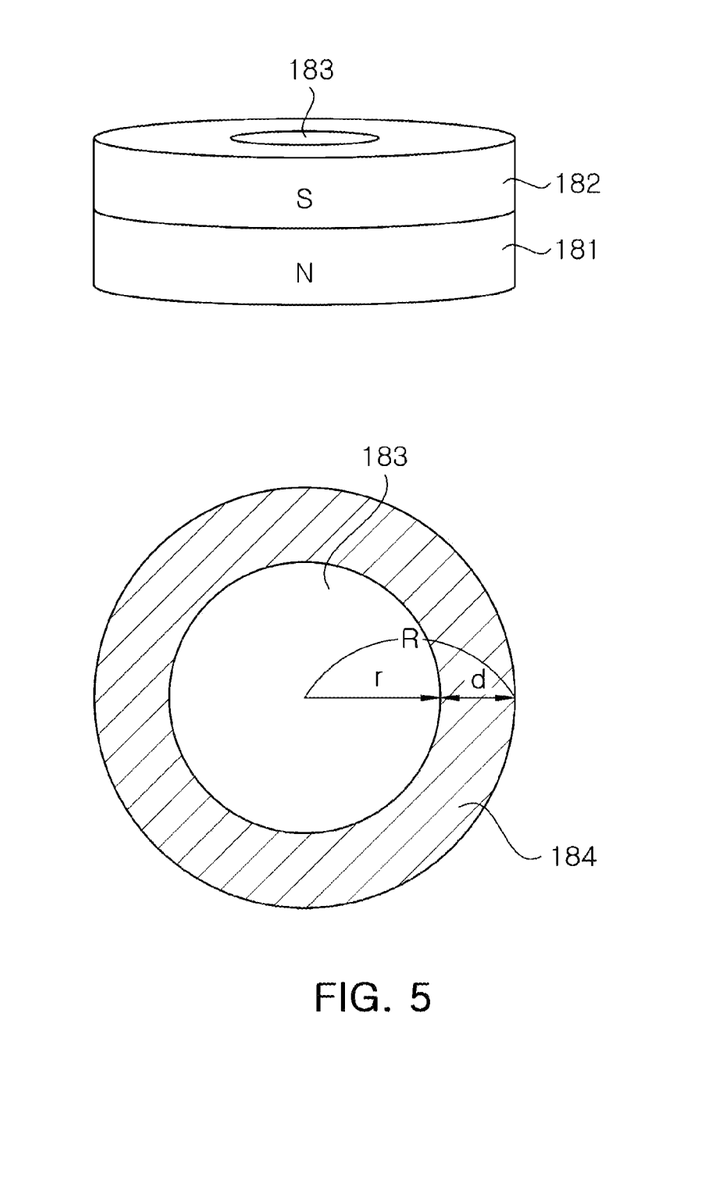
FIG. 5 is a view illustrating a shape of a permanent magnet in a plasma processing apparatus using a magnetic field according to an exemplary embodiment in the present disclosure.
Figure 6:
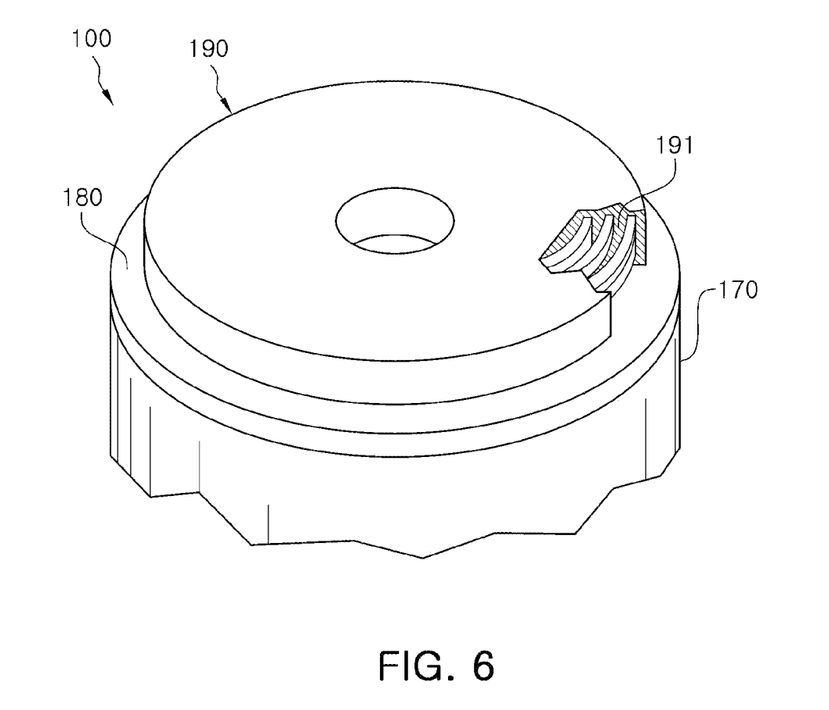
FIG. 6 is a view illustrating a shape of an electromagnet in a plasma processing apparatus using a magnetic field according to an exemplary embodiment in the present disclosure.
Figure 7:
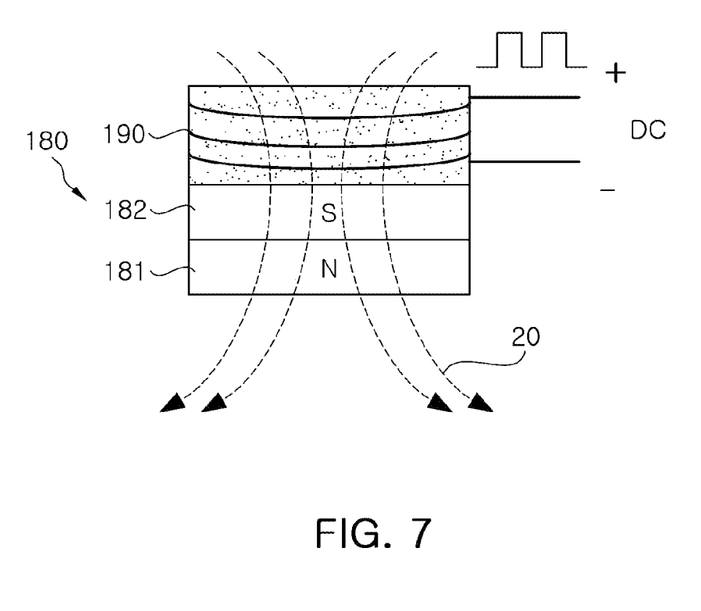
FIG. 7 is a conceptual view illustrating a magnetic module in which a permanent magnet and an electromagnet are coupled in a plasma processing apparatus using a magnetic field according to an exemplary embodiment in the present disclosure.

FIGS. 5 to 7 show specific shapes of the permanent magnet 180 and the electromagnet 190 in the plasma processing field according to an apparatus 100 using a magnetic exemplary embodiment in the present disclosure.

As illustrated in FIG. 5, the permanent magnet 180 is a ring-shaped magnet having a hole 183 therein, and a portion 184 of the permanent magnet 180 excluding the hole 183 and the middle region of the wafer S seated on the substrate support 150 may be disposed to correspond to each other.

Specifically, the portion 184 excluding the hole 183 forms a strong magnetic field in the permanent magnet 180, by positioning the middle region of the wafer S in which the inclination is formed in the plasma density to correspond to the portion 184 excluding the hole 183, a strong magnetic field may be affected on the middle region.

In addition, since the magnetic field being formed varies according to the area according to a length difference d between an outer diameter R and an inner diameter r, the permanent magnet 180 having a length difference d, varying according to a target etch rate of the wafer S may be used.

In other words, as illustrated in FIGS. 1 and 5, in order to adjust the etch rate in the middle region between the center region and the edge region of the wafer S, the ring-shaped permanent magnet 180 may be disposed such that the portion excluding the hole 183 is disposed on the upper plate 170 of the reaction chamber 110 corresponding to the middle region of the wafer S.

In addition, as an exemplary embodiment in the present disclosure, the electromagnet 190 disposed in a direction, perpendicular to the permanent magnet 180 may be included, and as illustrated in FIG. 6, the electromagnet 190 having a circular shape to correspond to the shape of the permanent magnet 180 may be disposed.

As illustrated in FIG. 6, the ring-shaped electromagnet 190 including a ring-shaped winding 191 configured by winding a single continuous conductor may be disposed above the permanent magnet 180. The DC power supply unit 210 is connected to both ends of the conductor constituting the ring-shaped winding 191. The ring-shaped electromagnet 190 may have a hole disposed on an axis of rotational symmetry of the ring, and the hole may be disposed to correspond to the hole 183 of the permanent magnet 180.

The exemplary embodiment described above is an example, and an electromagnet 190 of a form that does not correspond to the permanent magnet 180 may also be used, and as another exemplary embodiment in the present disclosure, an electromagnet 190 around which a coil wound with a magnetic core at the center may also be used. FIG. 7 is described based on the electromagnet 190 and the permanent magnet 180 according to another exemplary embodiment in the present disclosure.

As illustrated in FIG. 7, in the case of forming a magnetic module in which the electromagnet 190 around which a coil is wound in a horizontal direction with a magnetic core at the center of a permanent magnet 180 having a lower electrode 181 with an N pole and an upper electrode 182 with an S pole is coupled, a magnetic field 20 toward the inside of the reaction chamber 110 may be formed.

Plasma density on the surface of the wafer S is uniformly distributed by strongly controlling plasma or ion distribution based on the middle region of the wafer S by the magnetic field 20.

At this time, the magnetic field formed by the electromagnet 190 may be adjusted by adjusting power input to the electromagnet 190, and accordingly, since the magnetic field formed by the electromagnet 190 may cancel out or reinforce the magnetic field of the permanent magnet 180, while a predetermined magnetic field is continuously formed by the permanent magnet 180, plasma control may be performed with less power.

On the other hand, according to an exemplary embodiment in the present disclosure, in order to control power input to the electromagnet 190, a signal determining unit 220 for transmitting a determined power parameter to the DC power supply unit 210 supplying power to the electromagnet 190 may be further provided, which will be described later with reference to FIG. 8.

Figure 8:
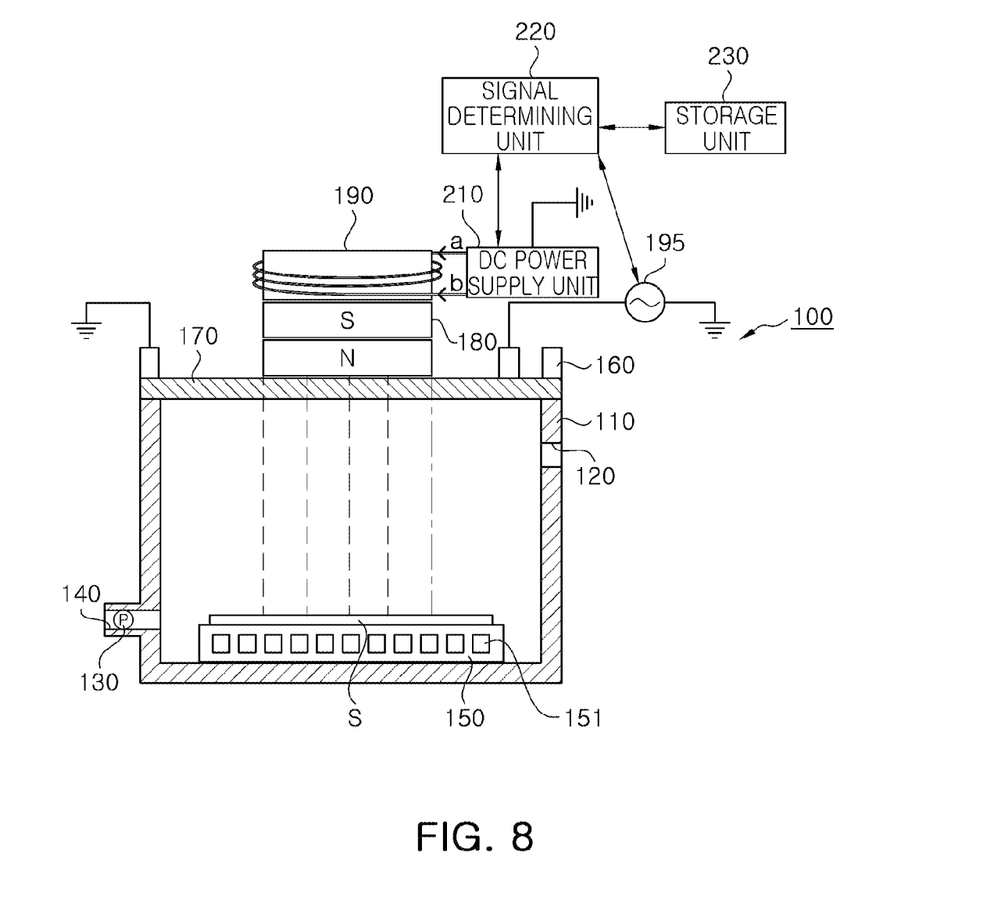
FIG. 8 is a cross-sectional view schematically illustrating a structure of a plasma processing apparatus using a magnetic field according to an exemplary embodiment in the present disclosure.

FIG. 8 is a schematic cross-sectional view of a structure of the plasma processing apparatus 100 using a magnetic field according to an exemplary embodiment in the present disclosure, and is a view illustrating a relationship between a permanent magnet and a wafer according to an exemplary embodiment in the present disclosure.

According to an exemplary embodiment in the present disclosure, the signal determining unit 220 for determining a power parameter input to the electromagnet 190 according to a difference in coercive force with the permanent magnet 180 in consideration of a target etch rate of the wafer S may be included.

The signal determining unit 220 according to an exemplary embodiment in the present disclosure may determine a strength or direction of a magnetic field to be formed by the electromagnet 190 in consideration of the magnetic field formed in the reaction chamber 110 and the magnetic field formed by the permanent magnet 180, and may determine a power parameter of at least one of a magnitude of current or voltage, a pulse duty ratio, and a current direction according to the determined strength or direction of the magnetic field.

At this time, the DC power supply unit 210 according to an exemplary embodiment in the present disclosure may include at least one DC power supply, and may input pulse power according to the power parameter determined by the signal determining unit 220 to the electromagnet 190.

The magnetic field generated by the permanent magnet 180 is maintained constant in the reaction chamber 110, and in order to further increase the etch rate, the electromagnet 190 generates a magnetic field in the same direction as that of the permanent magnet 180 to reinforce the strength of the magnetic field in the reaction chamber 110.

On the other hand, in a case in which a target etch rate of the wafer S is low so it is necessary to lower the etch rate, since the strength of the magnetic field generated by the permanent magnet 180 cannot be reduced, a magnetic field may be generated by the electromagnet 190 in a direction opposite to that of the permanent magnet 180 to cancel out the magnetic field, thereby reducing the strength of the magnetic field in the reaction chamber 110.

The etch rate may be adjusted by controlling an incident rate of plasma ions by adjusting the strength of the magnetic field.

That is, the strength of the magnetic field in the reaction chamber 110 may be reduced by adjusting a direction and strength of the magnetic field, and to this end, the signal determining unit 220 may control a direction of current, a magnitude of the current or voltage, and a pulse duty ratio to adjust the magnitude.

Therefore, the signal determining unit 220 according to an exemplary embodiment in the present disclosure may determine the strength and direction of the magnetic field to be formed by the electromagnet 190 in consideration of the magnetic field formed in the reaction chamber 110 and the magnetic field formed by the permanent magnet 180, and may determine a power parameter of at least one of the magnitude of current or voltage, a pulse duty ratio, and a current direction according to the determined strength and direction of the magnetic field.

Specifically, as illustrated in FIG. 8, the permanent magnet 180 is disposed to have an N pole on the bottom and an S pole on the top, and the electromagnet 190 may include a coil wound around a magnetic core in a horizontal direction, parallel to a direction of the magnetic field of the permanent magnet 180.

In addition, the signal determining unit 220 according to an exemplary embodiment in the present disclosure may determine a direction of current so that the directions of the magnetic fields formed by the permanent magnet 180 and the electromagnet 190 are the same to increase an etch rate of the surface of the wafer S.

For example, when the N pole is located on the bottom and the S pole is located on the top of the permanent magnet 180, a magnetic field is formed in a direction entering the reaction chamber 110. At this time, when the direction of current flowing through the electromagnet 190 is set to direction b, a magnetic field in the direction entering the reaction chamber 110 is formed according to the right-hand rule. That is, the magnetic field is reinforced, the strength of the magnetic field is increased, and a plasma ion incident rate is increased, so the etch rate is also increased.

Alternatively, the signal determining unit 220 may determine a current direction such that magnetic fields formed by the permanent magnet 180 and the electromagnet 190 are canceled out with each other in order to lower the etch rate of the surface of the wafer S.

For example, when the N pole is located on the bottom and the S pole is located on the top of the permanent magnet 180, a magnetic field is formed in a direction entering the reaction chamber 110, and at this time, when the direction of current flowing through the electromagnet 190 is set to direction a, a magnetic field in a direction leaving the reaction chamber 110 is formed according to the right-hand rule. That is, the magnetic fields are canceled out, the strength of the magnetic field is weakened, and the plasma ion incidence rate is reduced, so the etch rate is also lowered.

Therefore, it is possible to control the plasma density and the etch rate by controlling the magnitude of power supplied by the DC power supply unit 210 or a current direction according to a target etch rate desired in the wafer S.

In addition, the strength of the magnetic field generated by the electromagnet 190 may be adjusted by adjusting the strength of power applied to the electromagnet 190.

On the other hand, as illustrated in FIG. 8, according to an exemplary embodiment in the present disclosure, a storage unit 230 connected to the signal determining unit 220 may be further included, and the storage unit 230 may store a type of process to be performed, a current etch rate and a target etch rate of the wafer to be processed.

The signal determining unit 220 may identify the type of processing and preset setting values stored in the storage unit 230 and determine power parameters to be input to the electromagnet 190 accordingly.

Figure 9:
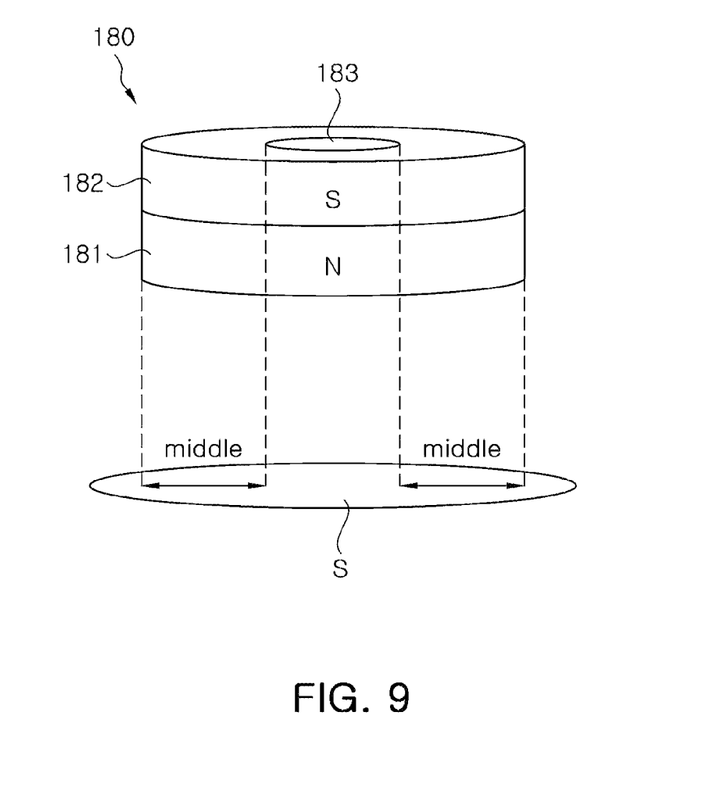
FIG. 9 is a view illustrating a relationship between a permanent magnet and a wafer according to an exemplary embodiment in the present disclosure.

In addition, as illustrated in FIG. 9, in order to adjust an etch rate in the middle region between the center region and the edge region of the wafer S, the ring-shaped permanent magnet 180 may be disposed so that the portion 184 excluding the hole 183 corresponds to the middle region of the wafer S.

According to an exemplary embodiment in the present disclosure, the permanent magnet 180 may be disposed on the upper plate of the reaction chamber such that at least a portion thereof overlaps the middle region of the wafer to adjust the etch rate in the middle region between the center region and the edge region of the wafer S.

Alternatively, as an exemplary embodiment, the permanent magnet 180 may be disposed in the middle region of the wafer S.

For example, as illustrated in FIG. 9, the permanent magnet 180 may be disposed such that the hole 183 corresponds to the center region and the portion 184 excluding the hole 183 accurately corresponds to the middle region, or may be disposed such that the portion 184 excluding the hole 183 at least partially overlaps a portion of the middle region of the wafer S.

The plasma density 10' may be uniformly controlled by disposing the permanent magnet 180 based on the middle region in which the inclination of the plasma density 10 is formed and tilted and a change range of the etch rate is large.

Meanwhile, according to an exemplary embodiment in the present disclosure, a temperature adjusting unit 151 may be further included to control a temperature of the electrostatic chuck 150 according to the type of the wafer S and the type of process to be performed.

Each injected gas also has a different etch rate, so the plasma density may be controlled by further controlling factors other than the magnetic field. At this time, the temperature may be adjusted by forming the temperature adjusting unit 151 installed on the electrostatic chuck 150, for example, a cooling line.

In addition, according to an exemplary embodiment in the present disclosure, the signal determining unit 220 may further include an RF power controller controlling a frequency or power of the RF power supply 195 according to the type of the wafer S and the type of process to be performed.

Plasma generation itself in the reaction chamber 110 may be controlled by controlling the power or frequency of the RF power supply 195 to have an auxiliary effect on plasma density control.

Figure 10:
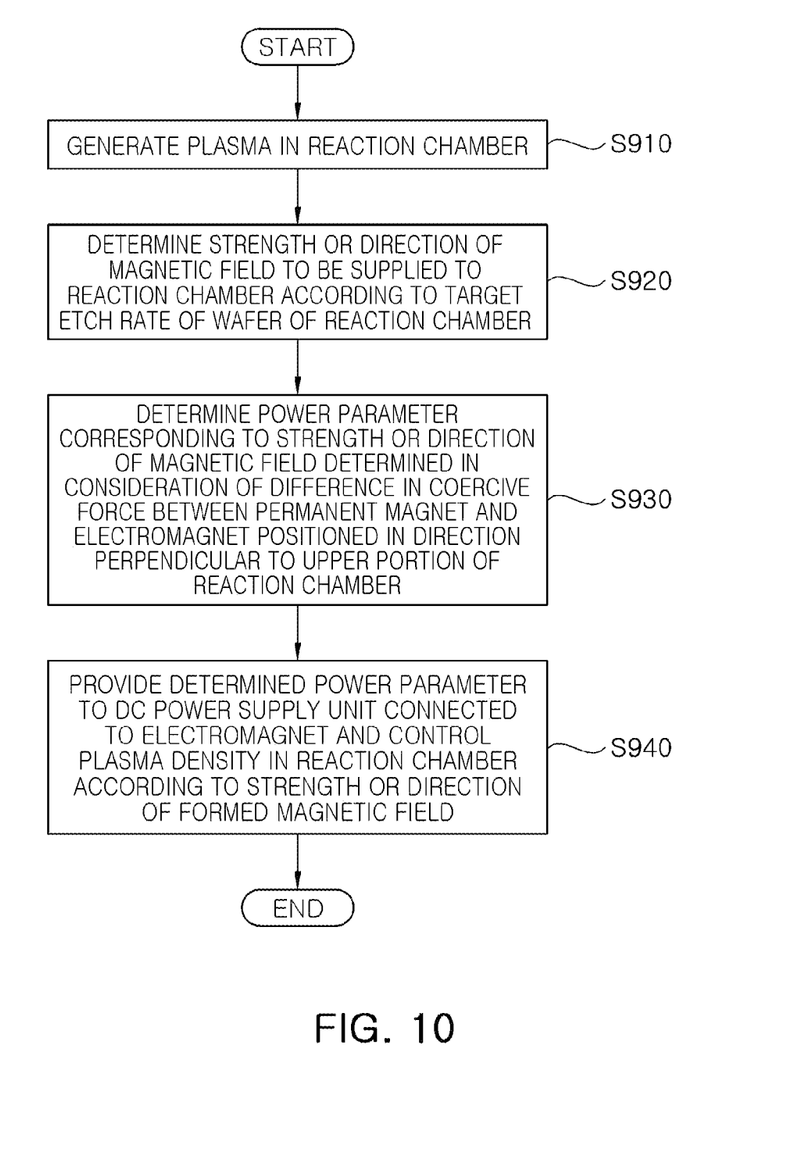
FIG. 10 is a flowchart of a plasma control method using a magnetic field according to an exemplary embodiment in the present disclosure.

FIG. 10 is a flowchart of a plasma control method using a magnetic field according to an exemplary embodiment in the present disclosure.

As illustrated in FIG. 10, the plasma control method according to an exemplary embodiment in the present disclosure may include generating plasma in the reaction chamber 110 (S910), determining a strength or direction of a magnetic field to be supplied to the reaction chamber 110 according to a target etch rate of the wafer S (S920), determining a power parameter corresponding to the strength or direction of the magnetic field determined in consideration of a difference in coercive force between the permanent magnet 180 and the electromagnet 190 positioned vertically above the reaction chamber (S930), and providing the determined power parameter to the DC power supply unit 210 connected to the electromagnet 190 and controlling a plasma density in the reaction chamber 110 according to the strength or direction of the formed magnetic field (S940).

According to an exemplary embodiment in the present disclosure, the magnetic fields of the permanent magnet 180 and the electromagnet 190 may be formed to be parallel.

In operation S930, a power supply parameter of at least one of a magnitude of current or voltage, a pulse duty ratio, and a current direction may be determined according to the determined strength or direction of the magnetic field.

In addition, in operation S930, in order to increase the etch rate of the surface of the wafer S, a current direction may be determined such that the directions of the magnetic fields formed by the permanent magnet 180 in which the N pole is on the bottom and the S pole is on the top and the electromagnet 190 are the same, or in order to lower the etch rate of the surface of the wafer S, the current direction may be determined such that the magnetic fields formed by the permanent magnet 180 and the electromagnet 190 are canceled out.

Descriptions that are the same as those given above are omitted for brevity of description.

While example exemplary embodiments have been illustrated and described above, it will be apparent to those skilled in the art that modifications and variations could be made without departing from the scope of the present disclosure as defined by the appended claims.

What is claimed is:

1. A plasma processing apparatus using a magnetic field, the plasma processing apparatus comprising:
a reaction chamber;
a plasma generator connected to the reaction chamber to generate plasma in the reaction chamber;
a substrate support disposed in a lower portion in the reaction chamber to support a wafer to be etched by the plasma; and
a magnetic module including a permanent magnet and an electromagnet disposed vertically above the reaction chamber and a DC power supply unit connected to the electromagnet to input power to the electromagnet,
wherein the permanent magnet is a ring-shaped magnet having a hole therein,
wherein an outer edge of the permanent magnet excluding the hole is disposed to correspond to an outer edge of a middle region of the wafer seated on the substrate support, and
wherein the middle region of the wafer is disposed between a center region and an edge region of the wafer;
wherein the plasma processing apparatus further comprises:
a signal determiner which determines a power parameter input to the electromagnet according to a difference in coercive force with the permanent magnet in consideration of a target etch rate of the wafer.

2. The plasma processing apparatus of claim 1, wherein the permanent magnet is disposed such that one magnetic pole thereof is directed to an inside of the reaction chamber and the other magnetic pole is directed to an outside of the reaction chamber.

3. The plasma processing apparatus of claim 2, wherein the electromagnet includes a magnetic core and a coil wound around the magnetic core, and the coil is wound to be horizontally disposed to reinforce or cancel out the magnetic field formed by the permanent magnet.

4. The plasma processing apparatus of claim 3, wherein the electromagnet is located on the top of the permanent magnet.

5. The plasma processing apparatus of claim 4, wherein magnetic fields of the permanent magnet and the electromagnet are formed to be parallel.

6. The plasma processing apparatus of claim 1, wherein the signal determiner determines a strength or direction of a magnetic field to be formed by the electromagnet in consideration of a magnetic field formed in the reaction chamber and a magnetic field formed by the permanent magnet, and
determines a power parameter of at least one of a magnitude of current or voltage, a pulse duty ratio, and a current direction according to the determined strength or direction of the magnetic field.

7. The plasma processing apparatus of claim 6, wherein the DC power unit includes at least one DC power supply unit, and inputs pulse power according to the power parameter determined by the signal determiner to the electromagnet.

8. The plasma processing apparatus of claim 1, wherein the permanent magnet and the electromagnet are installed on an outer wall of the reaction chamber.

9. The plasma processing apparatus of claim 1, wherein the electromagnet is ring-shaped and includes a hole, wherein the electromagnet includes a ring-shaped winding formed by winding a single continuous conductor, wherein the hole of the electromagnet is disposed to correspond to the hole of the permanent magnet.

10. A plasma processing apparatus using a magnetic field, the plasma processing apparatus comprising:
a reaction chamber;
a plasma generator including a plurality of tubular linear antennas connected to the reaction chamber and installed to be parallel above the reaction chamber and spaced apart from each other to generate plasma in the reaction chamber, and an RF power supply supplying RF power to the antennas to generate plasma in the reaction chamber;

an electrostatic chuck disposed in a lower portion in the reaction chamber and supporting a wafer to be etched by the plasma;

a magnetic module including:

a ring-shaped permanent magnet disposed on an upper plate of the reaction chamber,         wherein an outer edge of the permanent magnet is configured to correspond to an edge of a middle region of the wafer,         wherein the middle region of the wafer is disposed between a center region and an edge region of the wafer, and         wherein the permanent magnet is configured to adjust an etch rate in the middle region of the wafer,     an electromagnet disposed to be perpendicular to the permanent magnet, and     a DC power supply unit connected to the electromagnet and inputting power to the electromagnet; and a signal determiner determining current or voltage input to the electromagnet according to a difference in coercive force with the permanent magnet in consideration of a target etch rate of the wafer.

11. The plasma processing apparatus of claim 10, wherein at least one of an N pole and an S pole of the permanent magnet is disposed on the top and the other of the N pole and the S pole is disposed on the bottom, the electromagnet includes a coil wound horizontally around a magnetic core to be parallel to a direction of a magnetic field of the permanent magnet, and the signal determiner determines a strength and direction of a magnetic field to be formed by the electromagnet in consideration of a magnetic field formed in the reaction chamber and the magnetic field formed by the permanent magnet; and a power parameter of at least one of a magnitude of current or voltage, a pulse duty ratio, and a current direction is determined according to the determined strength and direction of the magnetic field.

12. The plasma processing apparatus of claim 11, wherein the N pole of the permanent magnet is disposed on the bottom and the S pole of the permanent magnet is disposed on the top, and the signal determiner determines a current direction so that the directions of the magnetic fields formed by the permanent magnet and the electromagnet are the same in order to increase an etch rate of a surface of the wafer.

13. The plasma processing apparatus of claim 11, wherein the signal determiner determines s current direction so that the magnetic fields formed by the permanent magnet and the electromagnet are cancelled out in order to lower the etch rate of the surface of the wafer.

14. The plasma processing apparatus of claim 11, wherein the signal determiner controls a frequency or power of the RF power supply according to a type of the wafer and a type of process to be performed.

15. The plasma processing apparatus of claim 10, wherein the permanent magnet is disposed in a middle region of the wafer.

* * * * *